(12) United States Patent
Phillips

(10) Patent No.: US 10,473,809 B2
(45) Date of Patent: Nov. 12, 2019

(54) APPARATUS AND METHOD FOR IDENTIFYING PHYSICAL SECURITY RISKS TO POWER TRANSMISSION STRUCTURES

(71) Applicant: Electric Power Research Institute, Inc., Charlotte, NC (US)

(72) Inventor: Andrew John Phillips, Harrisburg, NC (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 383 days.

(21) Appl. No.: 15/290,231

(22) Filed: Oct. 11, 2016

(65) Prior Publication Data

US 2017/0102476 A1 Apr. 13, 2017

Related U.S. Application Data

(60) Provisional application No. 62/240,046, filed on Oct. 12, 2015.

(51) Int. Cl.
*G01V 3/08* (2006.01)
*G01R 29/12* (2006.01)

(52) U.S. Cl.
CPC .............. *G01V 3/088* (2013.01); *G01R 29/12* (2013.01)

(58) Field of Classification Search
CPC .................................. G01V 3/088; G01R 29/12
See application file for complete search history.

(56) References Cited

U.S. PATENT DOCUMENTS

| 5,448,222 A * | 9/1995 | Harman | G08B 13/169 340/566 |
|---|---|---|---|
| 2008/0094212 A1* | 4/2008 | Breed | G08B 13/1663 340/541 |
| 2016/0170546 A1* | 6/2016 | Lee | G06F 3/0418 345/173 |

* cited by examiner

*Primary Examiner* — Amy He
(74) *Attorney, Agent, or Firm* — Trego, Hines & Ladenheim, PLLC; Brandon Trego; Jonathan Hines

(57) ABSTRACT

An apparatus and method for identifying physical security risks to power transmission structures and other associated assets of a power transmission system is disclosed. The apparatus includes a sensor having a sensor assembly; and a floating electrode electrically connected to the sensor and positioned adjacent to the asset being monitored. The floating electrode assumes a space potential created around the asset and provides a voltage signal to the sensor indicative of a voltage of the space potential. When an object approaches the asset, the space potential is impacted and the voltage signal changes to indicate the presence of the object.

20 Claims, 5 Drawing Sheets

APPARATUS AND METHOD FOR IDENTIFYING PHYSICAL SECURITY RISKS TO POWER TRANSMISSION STRUCTURES

BACKGROUND OF THE INVENTION

This invention relates generally to identifying security risks to power transmission systems, and more particularly to an apparatus and method for identifying physical security risks to power transmission structures and other associated assets of a power transmission system.

In 2013 and 2014, numerous physical attacks occurred to power transmission structures and associated assets. Example attacks over the past decade include (a) removing bolts from steel transmission line structures, (b) pulling over structures by attaching cables to the structure and using a vehicle to pull, and (c) attaching explosives to the structures. More recently, attacks included the use of a bulldozer.

As a result of recent attacks, in 2014, the North American Electric Reliability Corporation (NERC) issued an order requiring utilities to address the physical security of critical substations. Billions are being spent hardening and monitoring substations. In addition to substations, significant vulnerability exists for power transmission lines, mainly due to their exposure and widespread deployment. For example, damage to structures that cross large rivers and/or valleys and other primary power transmission lines would result in cascading failures.

Additionally, the physical security threat from the theft of power transmission line grounding material, mainly copper, from structures can result in the power transmission lines and associated structures being unprotected from lightning and other power surges, resulting in a public safety risk due to the lack of grounding.

Accordingly, there remains a need for an apparatus and method capable of identifying physical security risks to power transmission structures and associated assets.

BRIEF SUMMARY OF THE INVENTION

This need is addressed by the present invention, which provides an apparatus capable of determining when a security risk is proximate to power transmission assets and notifying proper authorities of the imminent security risk.

According to an aspect of the invention, an apparatus configured to monitor an asset includes a sensor having a sensor assembly; a floating electrode electrically connected to the sensor and positioned adjacent to the asset being monitored, wherein the floating electrode assumes a space potential created around the asset and provides a voltage signal to the sensor indicative of a voltage of the space potential; wherein when an object approaches the asset, the space potential is impacted and the voltage signal changes to indicate the presence of the object.

According to an aspect of the invention, a method of monitoring an asset includes the steps of providing an apparatus having a sensor assembly; mounting the sensor assembly to the asset being monitored; using the sensor assembly to monitor a condition of the asset; and using the sensor assembly to transmit an alarm when the condition of the asset exceeds a pre-determined threshold.

A method of monitoring an asset, includes the steps of providing an apparatus having a sensor; and a floating electrode electrically connected to the sensor; positioning the floating electrode adjacent to the asset being monitored; positioning the sensor adjacent to the asset being monitored; using the apparatus to measure a voltage at the asset; and using the apparatus to transmit an alarm to a remote receiver when the voltage drops below or exceeds a pre-determined threshold range.

BRIEF DESCRIPTION OF THE DRAWINGS

The invention may be best understood by reference to the following description taken in conjunction with the accompanying drawing figures, in which.

DETAILED DESCRIPTION OF THE INVENTION

Figure 1:
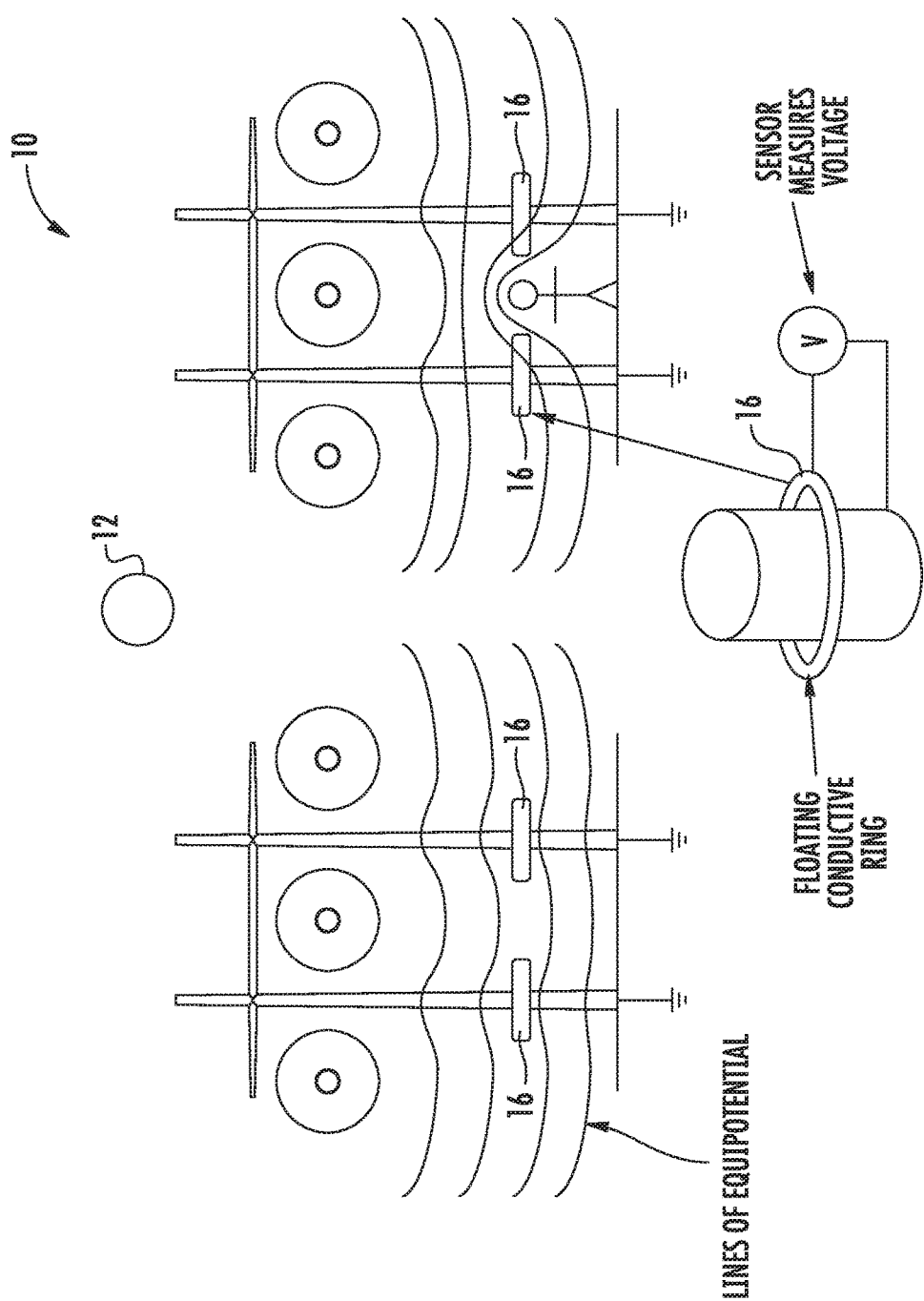
FIG. 1 shows an apparatus for identifying physical security risks.
Figure 2:
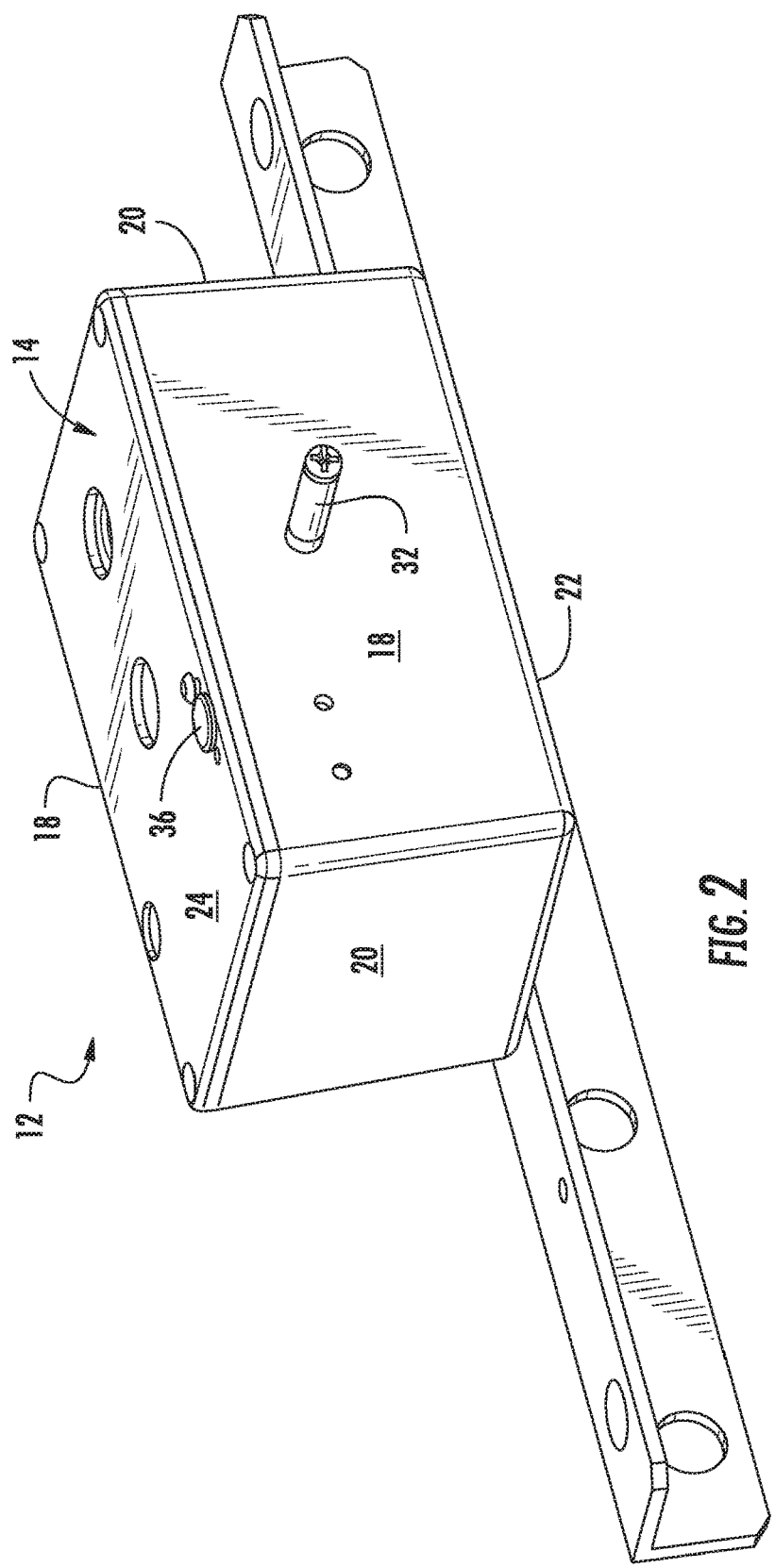
FIG. 2 is a perspective view of a sensor unit of the apparatus of FIG. 1.
Figure 3:
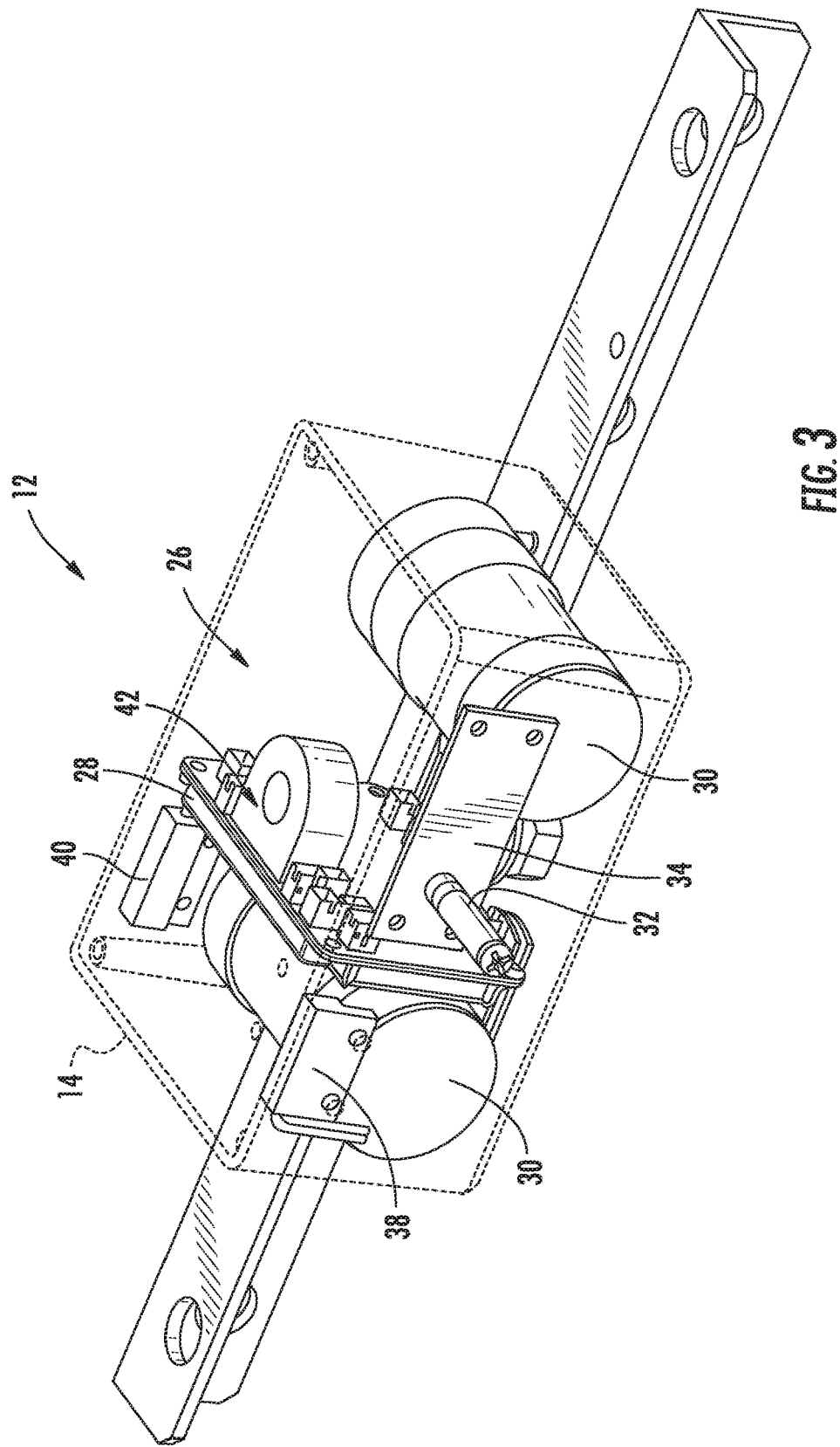
FIG. 3 shows internals of the sensor unit of FIG. 2.

Referring to the drawings wherein identical reference numerals denote the same elements throughout the various views, FIGS. 1-3 illustrates an apparatus 10 configured to monitor and transmit data representative of a security risk to and/or condition (such as vibration and/or inclination) of a power transmission asset. It should be appreciated that the term "power transmission asset" refers to any asset used to provide and/or transmit electricity to a user. These assets include but are not limited to electrical conductors, support structures, transformers, substations and its associated components, and power producing facilities and its associated components. It should also be appreciated that while this application discusses the invention with respect to power transmission assets, the invention applies to any asset (such as bridges) that require protection.

The apparatus 10 includes a sensor unit 12 for monitoring security risks. The sensor unit includes a housing 14 which encloses a sensor assembly 26 (described in more detail below) and protects them from electromagnetic influences. It should be appreciated that the housing may be metal, plastic, or any other suitable material. The sensor unit 12 is positioned in close proximity to and/or mounted to the power transmission asset to be protected and is electrically grounded or earthed, i.e. connected to a structure at electrical ground potential.

The apparatus 10 may also include a floating electrode 16 configured to be connected to the sensor unit 12 for voltage measurement by the sensor unit 12 (the sensor unit 12 can also be used to determine if a line is energized). As illustrated, the floating electrode 16 is attached to and/or positioned adjacent to a power transmission asset (as illustrated, the floating electrode 16 is a ring of conductive material such as copper pipe/tubing positioned around a structure—it should be appreciated that the floating electrode 16 may also be a linear tube of conductive material or any other suitable electrode of conductive material and shape), location and dimensions of floating electrode 16 will determine the size of the subject detected. The floating electrode 16 is electrically insulated from the power transmission asset. This can be done by using bushings or a coating around the electrode (insulating coating on the conductive material). The floating electrode 16 will assume the space potential created by the electric field from energized conductors. Energized single and three phase power lines (transmission and distribution) create electric and magnetic fields surrounding them. The electric field surrounding power transmission assets is very stable since the voltage is kept within tight limits. As shown in FIG. 1, if an object (individual, vehicle, animal, etc.) approaches a power transmission asset, the equipotential lines (lines of equal voltage created by energized conductors) are disturbed, thereby modifying the electric field.

The sensor unit 12 is shown in more detail in FIGS. 2 and 3. The housing 14 is generally rectangular and includes two spaced-apart sidewalls 18, two spaced-apart endwalls 20, a bottom wall 22, and a top wall 24. When used herein, the directional terms "top", "bottom", "side", etc. are merely for reference and do not imply that any specific orientation of the sensor unit 12 is required. It should also be appreciated that the shape and/or design of the housing 14 may be of any suitable design and/or shape to conform to a particular application—the generally rectangular shape is used as an example only.

The sensor assembly 26 is mounted in the housing 14. The configuration of the sensor assembly 26 may be varied to suit a particular application. In the example shown in FIG. 3, the sensor assembly 26 includes an electronics module 28 which functions to receive, process, and store signals, to receive external commands, and to transmit data to an external source. The electronics module 28 may include, for example, a printed circuit board incorporating analog, digital and/or radio-frequency ("RF") electronic components. The electronics module 28 may incorporate discrete components and/or one or more microprocessors. The components of the electronics module 28 may be embedded in potting compound to protect them environmental influences.

Figure 4:
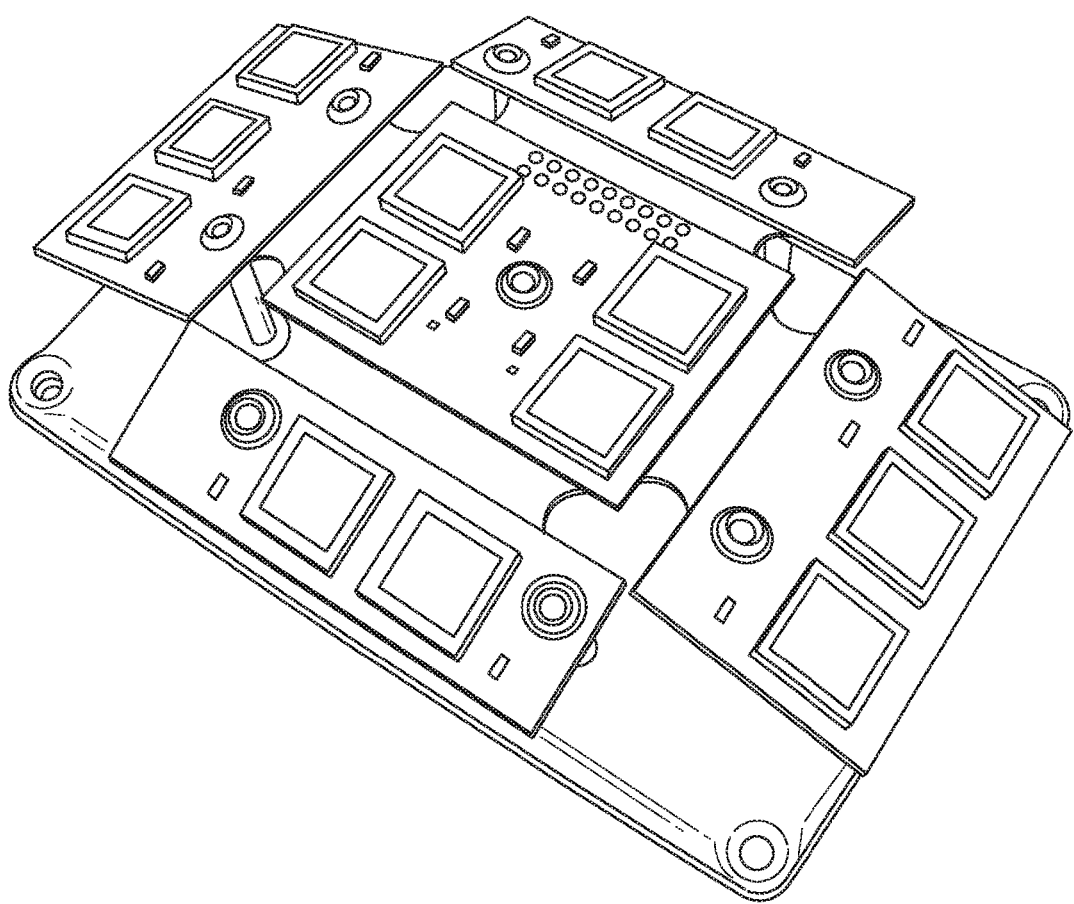
FIG. 4 shows a solar harvesting device for use with the apparatus of FIG. 1.

In addition to the electronics module 28, the housing 14 encloses an electric power source for the electronics module 28, such as the illustrated batteries 30 (for example, high density batteries such as lithium polymers), solar harvesting (FIG. 4), and/or electric field harvesting. Electric field harvesting may be accomplished by using a separate device (not shown) or by using the floating electrode 16 to harvest the electric field.

The housing 14 also includes one or more RF antennas 32 which protrude from the exterior of the housing 14 and are used to transmit signals generated by the electronics module 28 to a remote receiver (not shown), and/or to receive RF signals from a remote receiver (not shown). The sensor unit 12 incorporates a communication system 34 that may be based on the IEEE 805.15.4 architecture. The communication protocol allows two-way communications. It should be appreciated that the sensor unit 12 may also be hardwired for two-way communications. The electronics module 28 further includes a 3D solid state accelerometer 42. The accelerometer 42 may be used to assess whether the power transmission asset is experiencing vibrations and/or whether the inclination of the power transmission asset (with respect to gravity) has changed.

In the illustrated example, magnetically-operated switches are mounted inside the housing 14 and coupled to the electronics module 28. The switches may be tripped by placing a magnet 36 in the near vicinity of the switch on the outside of the housing 14. In the illustrated example, the sensor unit 12 includes a power switch 38 which toggles the sensor unit 12 between the on and off state, and a reset switch 40 which signals the sensor unit 12 to erase any stored data.

It should be appreciated that other suitable sensors and electronics may be included in the sensor unit 12. For example, global positioning devices and temperature sensors may be employed in the sensor unit 12.

Figure 5:
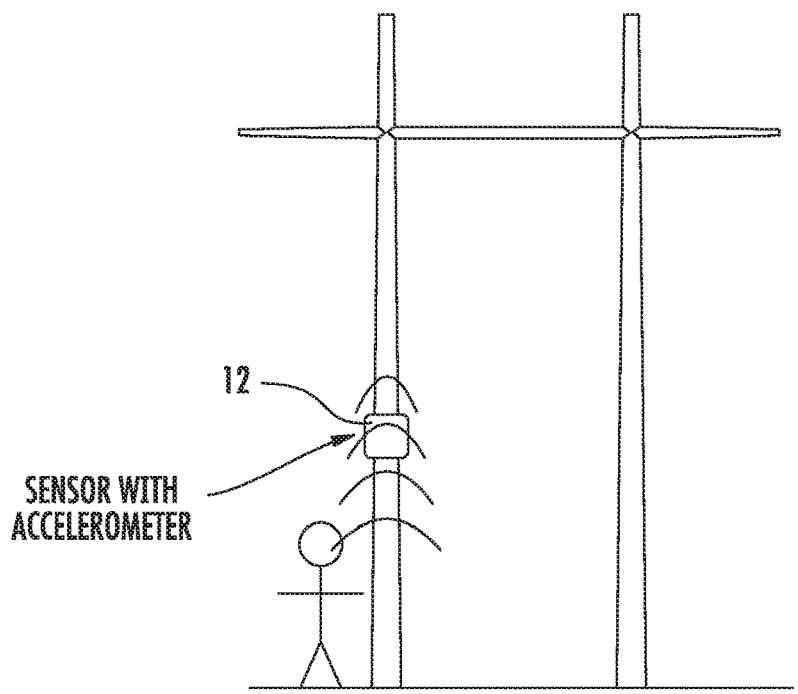
FIG. 5 shows the sensor unit of FIG. 2 mounted to an asset measuring vibrations.
Figure 6:
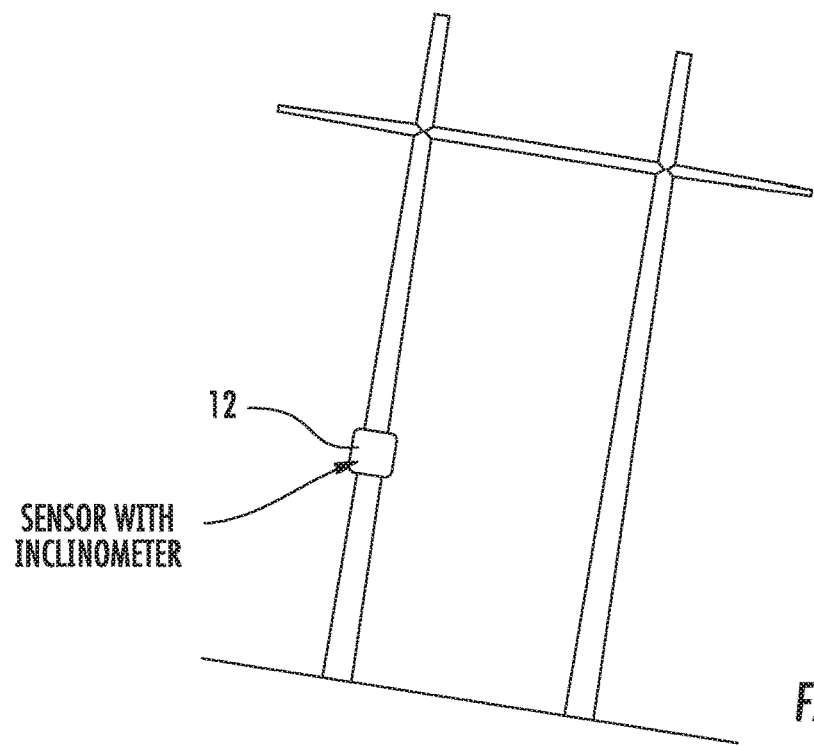
FIG. 6 shows the sensor unit of FIG. 2 mounted to an asset measuring inclination.

In use, the apparatus 10 is deployed at a power transmission asset in various configurations depending on the monitoring desired. For example, if conditions such as vibration and inclination are desired, the sensor unit 12 is mounted directly to the power transmission asset (FIGS. 5 and 6). If the user also wants to measure a condition such as voltage deflection, then the floating electrode 16 is also deployed and electrically connected to the sensor unit 12 for voltage measurement. Once the apparatus 10 is deployed, the electronics module 28 performs on-board processing of data being received at the power transmission asset, thereby providing a user with processed information on which he/she can make a decision. The electronics module 28 includes both analog and digital electronics and provides analog and digital signals to ensure that data is not missed by the user.

The apparatus 10 provides a user the ability to monitor several security risk situations. For example, the apparatus 10 can detect when an individual approaches the power transmission asset, when an individual has made contact with the power transmission asset, when an individual tampers with and/or is climbing the power transmission asset, when the power transmission asset has a change in inclination, and when a ground electrode has been disconnected.

To detect an individual and/or object (such as a vehicle, etc.) approaching the structure, the voltage of the floating electrode 16 is measured by the sensor unit 12. It should be appreciated that the voltage on the floating electrode 16 is dependent on the energized high voltage conductor configuration (over 50 kV), location, and dimensions of the electrode. If an individual approaches the structure the space potential will be impacted and the voltage on the floating electrode will change. For example, the floating electrode 16 might have a normal voltage (i.e. no obstruction) of 90 volts with a normal range of between 88 and 92 volts. When the individual approaches the structure, the voltage goes up by five percent (94.5 volts) and when the individual touches the structure, the voltage goes down to 85.5 volts. The larger the intruder or the closer they get the larger the voltage deflection (for example ten percent). This is shown in FIG. 1 as the equipotential lines deflect. The E-field distribution from the energized structure is very stable, as the voltage limits of the transmission system are kept with tight tolerances to ensure stability of the grid. This makes the sensor system stable. Algorithms based on the magnitude and rate of change in voltage may be used to mitigate false alarms and determine the nature of the threat. In initial testing, the apparatus 10 was positioned under a 138 kV transmission line. The apparatus 10 was able to detect an intruder at distances as far away as four meters from the structure.

To detect if an intruder has made contact with the structure—the voltage on the floating electrode will be monitored. As the intruder makes contact a sudden change in the voltage will suddenly change as the equipotential around the intruder will become that of the grounded structure.

To detect tampering of a structure, climbing, removing a bolt, cutting, attaching an explosive, etc. the vibrations on the structure are detected using the accelerometer 42. Pattern recognition algorithms are used to reduce false positive and characterize the type of threat. See FIG. 5.

To detect whether a structure is changing in inclination (due to physical attack or even due to environmental degradation, high speed winds, foundation subsidement, etc.), the same accelerometer 42 is used to continually monitor inclination. Alarm thresholds are set to determine if the structure is outside of compliance. See FIG. 6, for example greater than 15 degrees relative to vertical.

To detect if a ground electrode has been disconnected, due to theft or other reasons such as corrosion, the voltage between the floating electrode and structure is monitored. The voltage may collapse to a low voltage (close to zero) or suddenly increase as the structure may rise to a voltage set by the electric field.

The foregoing has described an apparatus and method for identifying physical security risks to power transmission structures. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends any novel one, or any novel combination, of the features disclosed in this specification (including any accompanying claims, abstract and drawings), or to any novel one, or any novel combination, of the steps of any method or process so disclosed.

I claim:

1. An apparatus to monitor security risks to a power transmission asset of a power transmission system, comprising:
    (a) a sensor having a sensor assembly;
    (b) a floating electrode electrically connected to the sensor and positioned adjacent to the power transmission asset being monitored, wherein the floating electrode assumes a space potential created around the power transmission asset and provides a voltage signal to the sensor indicative of a voltage of the space potential;
    (c) wherein when an object approaches the power transmission asset, the space potential is impacted and the voltage signal changes to indicate the presence of the object.

2. The apparatus of claim 1, wherein the sensor further includes a housing configured to enclose the sensor assembly and protect the sensor assembly from electromagnetic influences.

3. The apparatus of claim 1, wherein the sensor assembly includes an electronics module configured to receive, process, and store signals.

4. The apparatus of claim 1, wherein the sensor assembly includes an electronics module configured to transmit signals via an antenna to a remote receiver.

5. The apparatus according to claim 1, wherein the floating electrode is connected to the power transmission asset.

6. The apparatus according to claim 1, wherein the floating electrode is a ring formed of a conductive material and is positioned around the power transmission asset.

7. The apparatus according to claim 1, wherein the floating electrode is a linear bar or tube formed of a conductive material.

8. A method of monitoring security risks to a power transmission asset of a power transmission system, comprising the steps of:
    (a) providing an apparatus having a sensor assembly and a floating electrode connected to the sensor assembly;
    (b) mounting the sensor assembly to the power transmission asset being monitored;
    (c) using the sensor assembly to monitor a condition of the power transmission asset; and
    (d) using the sensor assembly to transmit an alarm when the condition of the power transmission asset exceeds a pre-determined threshold.

9. The method according to claim 8, further including the step of positioning the floating electrode adjacent to the power transmission asset being monitored, wherein the floating electrode assumes a space potential created around the power transmission asset being monitored.

10. The method according to claim 9, further including the step of using the sensor assembly to measure a voltage signal from the floating electrode.

11. The method according to claim 10, wherein when an object approaches the power transmission asset being monitored, the space potential is impacted and the voltage signal changes.

12. The method according to claim 10, wherein when a ground electrode has been disconnected from the power transmission asset, the voltage signal changes.

13. The method according to claim 10, further including the step of using the sensor assembly to transmit an alarm when the voltage signal drops below or exceeds a pre-determined threshold range.

14. The method according to claim 8, wherein the condition of the power transmission asset being measured by the sensor assembly includes vibration of the power transmission asset and inclination of the power transmission asset.

15. A method of monitoring security risks to a power transmission asset of a power transmission system, comprising the steps of:
    (a) providing an apparatus having:
        (i) a sensor; and
        (ii) a floating electrode electrically connected to the sensor;
    (b) positioning the floating electrode adjacent to the power transmission asset being monitored;
    (c) positioning the sensor adjacent to the power transmission asset being monitored;
    (d) using the apparatus to measure a voltage at the power transmission asset; and
    (e) using the apparatus to transmit an alarm to a remote receiver when the voltage drops below or exceeds a pre-determined threshold range.

16. The method according to claim 15, wherein the floating electrode is connected to the power transmission asset and insulated therefrom.

17. The method according to claim 15, wherein the floating electrode assumes a space potential created around the power transmission asset and provides a voltage signal to the sensor for measurement.

18. The method according to claim 17, wherein the voltage signal changes when an object approaches the power transmission asset or when a ground electrode has been disconnected from the power transmission asset.

19. The method according to claim 18, wherein the voltage signal increases as an object approaches the power transmission asset and decreases when the object touches the power transmission asset.

20. The method according to claim 18, wherein the voltage signal decreases when the ground electrode is disconnected from the power transmission asset.

* * * * *